(12) United States Patent
Ikeda et al.

(10) Patent No.: US 11,604,102 B2
(45) Date of Patent: *Mar. 14, 2023

(54) SEMICONDUCTOR DEVICE, TEMPERATURE SENSOR AND POWER SUPPLY VOLTAGE MONITOR

(71) Applicant: RENESAS ELECTRONICS CORPORATION, Tokyo (JP)

(72) Inventors: Masanori Ikeda, Tokyo (JP); Tadashi Kameyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 53 days.

This patent is subject to a terminal disclaimer.

(21) Appl. No.: 17/232,902

(22) Filed: Apr. 16, 2021

(65) Prior Publication Data

US 2021/0231508 A1    Jul. 29, 2021

Related U.S. Application Data

(63) Continuation of application No. 16/519,496, filed on Jul. 23, 2019, now Pat. No. 11,009,407, which is a continuation of application No. 15/473,979, filed on Mar. 30, 2017, now Pat. No. 10,408,687.

(30) Foreign Application Priority Data

Apr. 27, 2016 (JP) ................................. 2016-088886

(51) Int. Cl.
G01K 13/00 (2021.01)
G01K 7/01 (2006.01)
(Continued)

(52) U.S. Cl.
CPC ............... *G01K 13/00* (2013.01); *G01K 7/01* (2013.01); *G01K 15/005* (2013.01); *G01R 21/133* (2013.01)

(58) Field of Classification Search
USPC .................................. 374/170, 1, 142, 163
See application file for complete search history.

(56) References Cited

U.S. PATENT DOCUMENTS 9,146,598 B2    9/2015  Kameyama et al.
9,360,381 B2    6/2016  Arisaka et al.
(Continued)

FOREIGN PATENT DOCUMENTS

CN        102735360 A    10/2012
JP       2011-086742 A    4/2011
(Continued)

OTHER PUBLICATIONS

Japanese Notice of Reasons for Refusal issued in corresponding Japanese Patent Application No. 2016-088886, dated Aug. 20, 2019, with English translation.
(Continued)

*Primary Examiner* — Mirellys Jagan
(74) *Attorney, Agent, or Firm* — McDermott Will & Emery LLP

(57) ABSTRACT

According to one embodiment, a semiconductor device 1 includes a temperature sensor module 10 that outputs a non-linear digital value with respect to temperature and a substantially linear sensor voltage value with respect to the temperature, a storage unit 30 that stores the temperature, the digital value, and the sensor voltage value, and a controller 40 that calculates a characteristic formula using the temperature, the digital value, and the sensor voltage value stored in the storage unit 30, in which the temperature, the digital value, and the sensor voltage value stored in the storage unit 30 include absolute temperature under measurement of absolute temperature, the digital value at the absolute temperature, and the sensor voltage value at the absolute temperature.

6 Claims, 14 Drawing Sheets

(51) Int. Cl.
   *G01K 15/00*   (2006.01)
   *G01R 21/133*  (2006.01)

(56) References Cited

U.S. PATENT DOCUMENTS

| | | | |
|---|---|---|---|
| 9,389,127 | B2 | 7/2016 | Kameyama et al. |
| 2002/0158680 | A1 | 10/2002 | Pertus et al. |
| 2008/0069176 | A1 | 3/2008 | Pertijs et al. |
| 2010/0265473 | A1 | 10/2010 | Yamashita et al. |
| 2012/0133427 | A1 | 5/2012 | Kim et al. |
| 2018/0259985 | A1 | 9/2018 | Im et al. |

FOREIGN PATENT DOCUMENTS

| | | | |
|---|---|---|---|
| JP | 2012-220437 | A | 11/2012 |
| JP | 2013-064677 | A | 4/2013 |
| JP | 2014-145704 | A | 8/2014 |

OTHER PUBLICATIONS

Taiwanese Office Action issued in corresponding Taiwanese Patent Application No. 106112847, dated Nov. 12, 2020, with English translation.
European Search Report issued in corresponding European Patent Application No. 17168152.1, dated Sep. 12, 2017.
U.S. Patent Office Non-Final Office Action issued in parent U.S. Appl. No. 15/473,979, dated Jan. 17, 2019.
U.S. Patent Office Notice of Allowance issued in parent U.S. Appl. No. 15/473,979, dated May 1, 2019.
Entire U.S. Patent Office Image File Wrapper (IFW) associated with parent U.S. Appl. No. 15/473,979, filed Mar. 30, 2017.
U.S. PTO Non-Final Office Action issued in related parent U.S. Appl. No. 16/519,496, dated Oct. 26, 2020.
U.S. PTO Notice of Allowance issued in related parent U.S. Appl. No. 16/519,496, dated Feb. 5, 2021.
Entire U.S. Patent Office Image File Wrapper (IFW) associated with parent U.S. Appl. No. 16/519,496, filed Jul. 23, 2019.

SEMICONDUCTOR DEVICE, TEMPERATURE SENSOR AND POWER SUPPLY VOLTAGE MONITOR

CROSS-REFERENCE TO RELATED APPLICATIONS

This application is a Continuation of U.S. patent application Ser. No. 16/519,496, filed Jul. 23, 2019, which is a Continuation of U.S. patent application Ser. No. 15/473,979, filed on Mar. 30, 2017, which is based upon and claims the benefit of priority from Japanese Patent Application No. 2016-088886, filed on Apr. 27, 2016, the disclosure of which are incorporated herein in their entirety by reference.

BACKGROUND

The present invention relates to a semiconductor device, a temperature sensor, and a power supply voltage monitor, and relates to, for example, a semiconductor device, a temperature sensor, and a power supply voltage monitor capable of measuring temperature and a power supply voltage with high accuracy.

An in-vehicle information terminal has not only a navigation function but also TV, DVD, and audio functions and has tended to have more and more functions. A semiconductor device used in such an in-vehicle information terminal includes a temperature sensor module that monitors temperature of the semiconductor device therein in order to achieve high-speed processing.

As a technique related to the temperature sensor module, Japanese Unexamined Patent Application Publication No. 2013-064677 is, for example, disclosed.

Japanese Unexamined Patent Application Publication No. 2014-145704 discloses a technique for correcting temperature characteristics for each temperature sensor module using a value of variations in characteristics obtained upon checking the characteristics of semiconductors during manufacture thereof.

SUMMARY

In order to perform correction with high accuracy in the method of correcting the temperature characteristics for each temperature sensor module using the value of variations in the characteristics obtained upon checking the characteristics of semiconductors during manufacture thereof in, for example, Japanese Unexamined Patent Application Publication No. 2014-145704, it is required to increase the number of test processes in a wafer state where absolute temperature of the semiconductor chip can be measured, which causes the cost to be increased.

An embodiment has been made in order to solve the aforementioned problem and provides a semiconductor device, a temperature sensor, and a power supply voltage monitor capable of measuring temperature and a power supply voltage with high accuracy.

The other problems of the related art and the novel characteristics of the present invention will be made apparent from the descriptions of the specification and the accompanying drawings.

According to one embodiment, a semiconductor device includes a temperature sensor module that outputs a non-linear digital value with respect to temperature and a substantially linear sensor voltage value with respect to the temperature; a storage unit that stores the temperature, the digital value, and the sensor voltage value; and a controller that calculates a characteristic formula using the temperature, the digital value, and the sensor voltage value stored in the storage unit, in which the temperature, the digital value, and the sensor voltage value stored in the storage unit include absolute temperature under measurement of absolute temperature, the digital value at the absolute temperature, and the sensor voltage value at the absolute temperature.

According to the embodiment, it is possible to provide a semiconductor device, a temperature sensor, and a power supply voltage monitor capable of measuring temperature and a power supply voltage with high accuracy.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
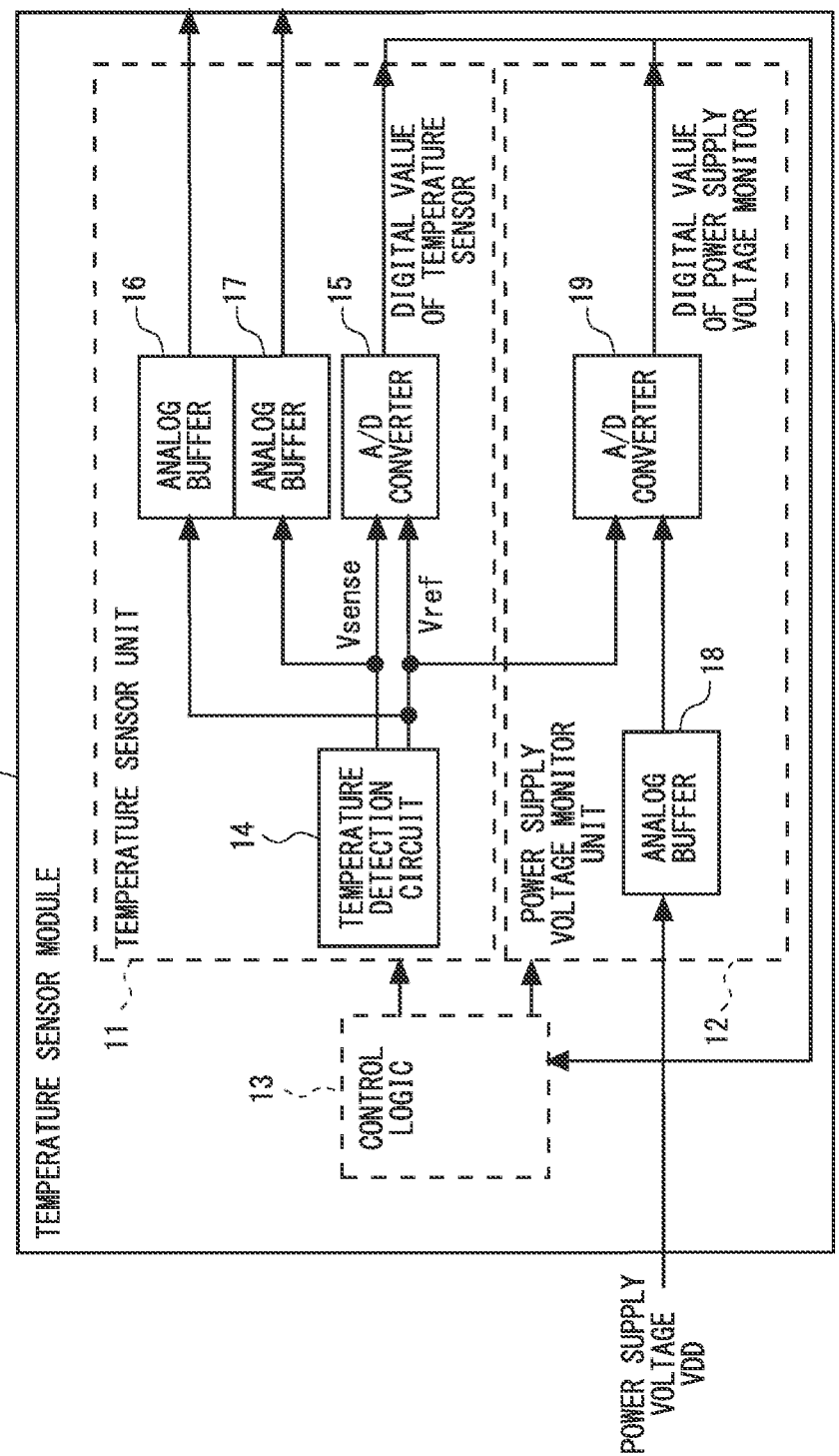
FIG. 1 is a configuration diagram that exemplifies a temperature sensor module.

For the clarification of the description, the following description and the drawings may be omitted or simplified as appropriate. Further, each element shown in the drawings as functional blocks that perform various processing can be formed of a CPU, a memory, and other circuits in hardware and may be implemented by programs loaded in the memory in software. Those skilled in the art will therefore understand that these functional blocks may be implemented in various ways by only hardware, only software, or the combination thereof without any limitation. Throughout the drawings, the same components are denoted by the same reference symbols and overlapping descriptions will be omitted as appropriate.

First, with reference to FIGS. 1 to 3, in order to make clear the structure of a temperature sensor module according to embodiments, a method of correcting temperature characteristics of the temperature sensor module discussed by the present inventors will be described.

FIG. 1 is a configuration diagram that exemplifies the temperature sensor module. A temperature sensor module 10 embedded in a semiconductor device includes a temperature sensor unit 11, a power supply voltage monitor unit 12, and a control logic 13. The temperature sensor unit 11 further includes a temperature detection circuit 14, an A/D converter 15, and analog buffers 16 and 17. The power supply voltage monitor unit 12 includes an analog buffer 18 and an A/D converter 19. The temperature detection circuit 14 is, for example, a bandgap reference circuit (a BGR circuit). The temperature sensor unit 11 and the power supply voltage monitor unit 12 are also collectively called an analog unit.

Figure 2:
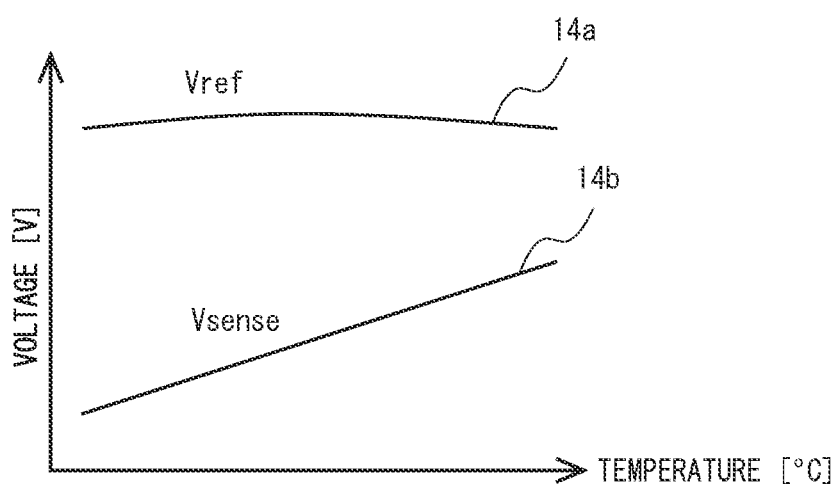
FIG. 2 is a graph that exemplifies temperature characteristics of a voltage value and a sensor voltage value output from a temperature detection circuit, in which the horizontal axis indicates temperature and the vertical axis indicates the voltage value.

As shown in FIG. 2, in the temperature sensor unit 11, the temperature detection circuit 14 outputs a voltage value Vref indicating a somewhat arcuate (having a peak at the room temperature) characteristic 14a with respect to a junction temperature Tj and a sensor voltage value Vsense indicating a substantially linear characteristic 14b with respect to the junction temperature Tj. The junction temperature Tj indicates temperature of an in-chip PN junction of a semiconductor product. The voltage value Vref and the sensor voltage value Vsense output from the temperature detection circuit 14 are combined with each other and the combined value is converted into a digital value as a temperature sensor by the A/D converter 15 shown in FIG. 1.

On the other hand, in the power supply voltage monitor unit 12, a power supply voltage VDD in the semiconductor device (this is also called an internal voltage in the semiconductor device) and the voltage value Vref are combined with each other and the combined value is converted into a digital value of a power supply voltage monitor by the A/D converter 19 shown in FIG. 1. The A/D conversion is performed based on the correlation obtained in characterization using a specific conversion formula or a conversion table.

The digital value after the A/D conversion is stored in a register in the control logic 13 and is monitored.

Figure 3:
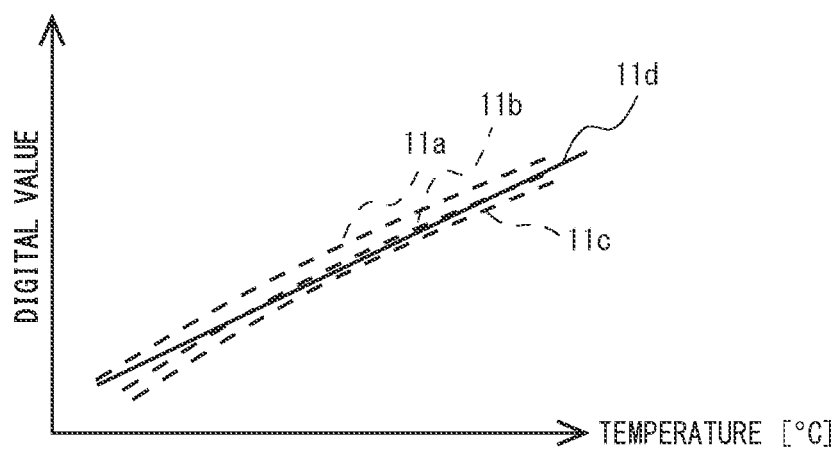
FIG. 3 is a graph that exemplifies temperature characteristics of a digital value output from the temperature sensor module, in which the horizontal axis indicates temperature and the vertical axis indicates the digital value.

As shown in FIG. 3, temperature sensor modules 10 indicate various characteristics 11a to 11c that reflect variations of the specific characteristics of the respective temperature sensor modules 10 in digital values of the temperature sensor after the A/D conversion. There is a method of collectively adjusting the offset of the characteristics 11a to 11c that are varied to a characteristic 11d. However, since the offset is collectively adjusted in this method, it is impossible to perform correction while reflecting the arcuate (non-linear) characteristics of the voltage value Vref. Further, in order to perform the correction while reflecting the arcuate characteristics, it may be possible to increase the number of test processes where the characterization is performed in a wafer state. However, since the number of test processes is increased, the cost is also increased.

First Embodiment

Figure 4:
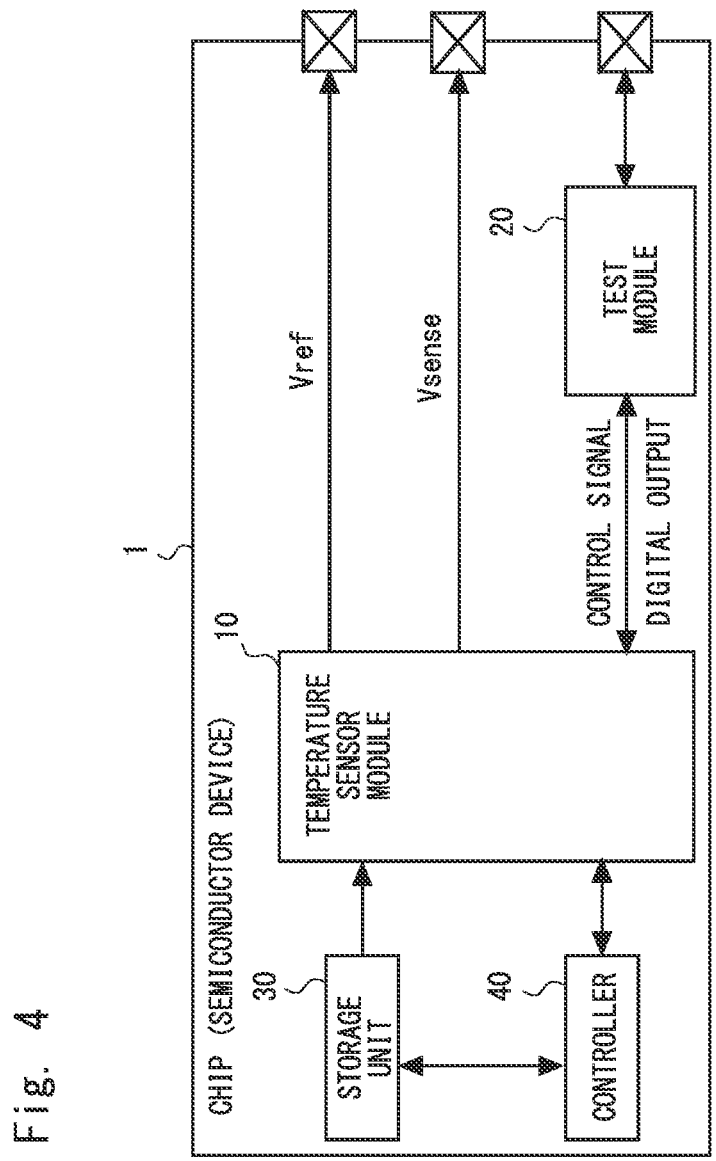
FIG. 4 is a configuration diagram that exemplifies a semiconductor device according to a first embodiment.

A semiconductor device according to a first embodiment will be described. First, a configuration of the semiconductor device according to the first embodiment will be described. FIG. 4 is a configuration diagram that exemplifies a semiconductor device 1 according to the first embodiment. As shown in FIG. 4, the semiconductor device 1 includes a temperature sensor module 10, a test module 20, a storage unit 30, and a controller 40. The semiconductor device 1 is not limited to the semiconductor device 1 used for in-vehicle information terminals and may be used for desired semiconductor devices such as mobile information terminals or high-speed computers.

As shown in FIGS. 1 and 4, the temperature sensor module 10 includes the temperature sensor unit 11, the power supply voltage monitor unit 12, and the control logic 13. The temperature sensor unit 11 includes the temperature detection circuit 14 therein. The temperature detection circuit 14 is, for example, a bandgap reference circuit (a BGR circuit).

As shown in FIG. 2, the temperature detection circuit 14 outputs the analog voltage value Vref indicating the somewhat arcuate (having a peak at the room temperature) non-linear characteristic 14a with respect to the junction temperature Tj and the analog sensor voltage value Vsense indicating a substantially linear characteristic 14b with respect to the junction temperature Tj. The power supply voltage monitor unit 12 monitors the power supply voltage VDD in the semiconductor device 1 (this voltage is also called an internal voltage in the semiconductor device 1).

The temperature sensor module 10 outputs a digital value THCODE. The digital value THCODE corresponds to the digital value obtained by converting, by the A/D converter 15, the analog sensor voltage value Vsense in combination with the analog voltage value Vref. Since the voltage value Vref has a somewhat arcuate non-linear characteristic with respect to the junction temperature Tj, the digital value THCODE also has a non-linear characteristic with respect to the temperature. The temperature sensor module 10 outputs, for example, a sensor voltage value Vsense_H and a digital value THCODE_H at a high temperature and a sensor voltage value Vsense_L and a digital value THCODE_L at a low temperature.

Further, the temperature sensor module 10 outputs a digital value of a power supply voltage monitor. The digital value (power supply voltage digital value) of the power supply voltage monitor is obtained by A/D converting, by the A/D converter 19, the power supply voltage VDD in the semiconductor device 1 in combination with the analog voltage value Vref.

The test module 20 controls the temperature sensor module 10 from an external terminal. A control signal input through the external terminal is input to the temperature sensor module 10 via the test module 20. Further, an output signal output from the temperature sensor module 10 can be extracted from the external terminal to the outside via the test module 20.

The storage unit 30 is, for example, a fuse-type memory (FUSE). The storage unit 30 stores temperatures, digital values, sensor voltage values and the like. The storage unit 30 outputs, based on the control signal output from the controller 40 when the semiconductor device 1 is started up, the digital value, the temperature, the sensor voltage value and the like that have been stored to the control logic 13, the controller 40 and the like of the temperature sensor module 10.

The controller 40 is, for example, a central processing unit (CPU). The controller 40 reads the temperature, the digital value, and the sensor voltage value stored in the storage unit 30 through the register of the control logic 13 of the temperature sensor module 10, the register of the controller 40 and the like. Further, the controller 40 calculates characteristic formulae using the temperature, the digital value, and the sensor voltage value stored in the storage unit 30.

The characteristic formulae are formulae to convert the digital values output from the A/D converters 15 and 19 into temperature values and to correct the temperature characteristics of the temperature sensor module 10. When the temperature inside the semiconductor device 1 is changed, the digital value is also changed since the variation in the characteristics of the bandgap reference circuit causes variation in the reference voltage. The above formulae take these variations into consideration. In this embodiment, the variation in the reference voltage due to the change in the temperature is considered.

Next, a method of manufacturing the semiconductor device 1 according to the first embodiment will be described.

Figure 5:
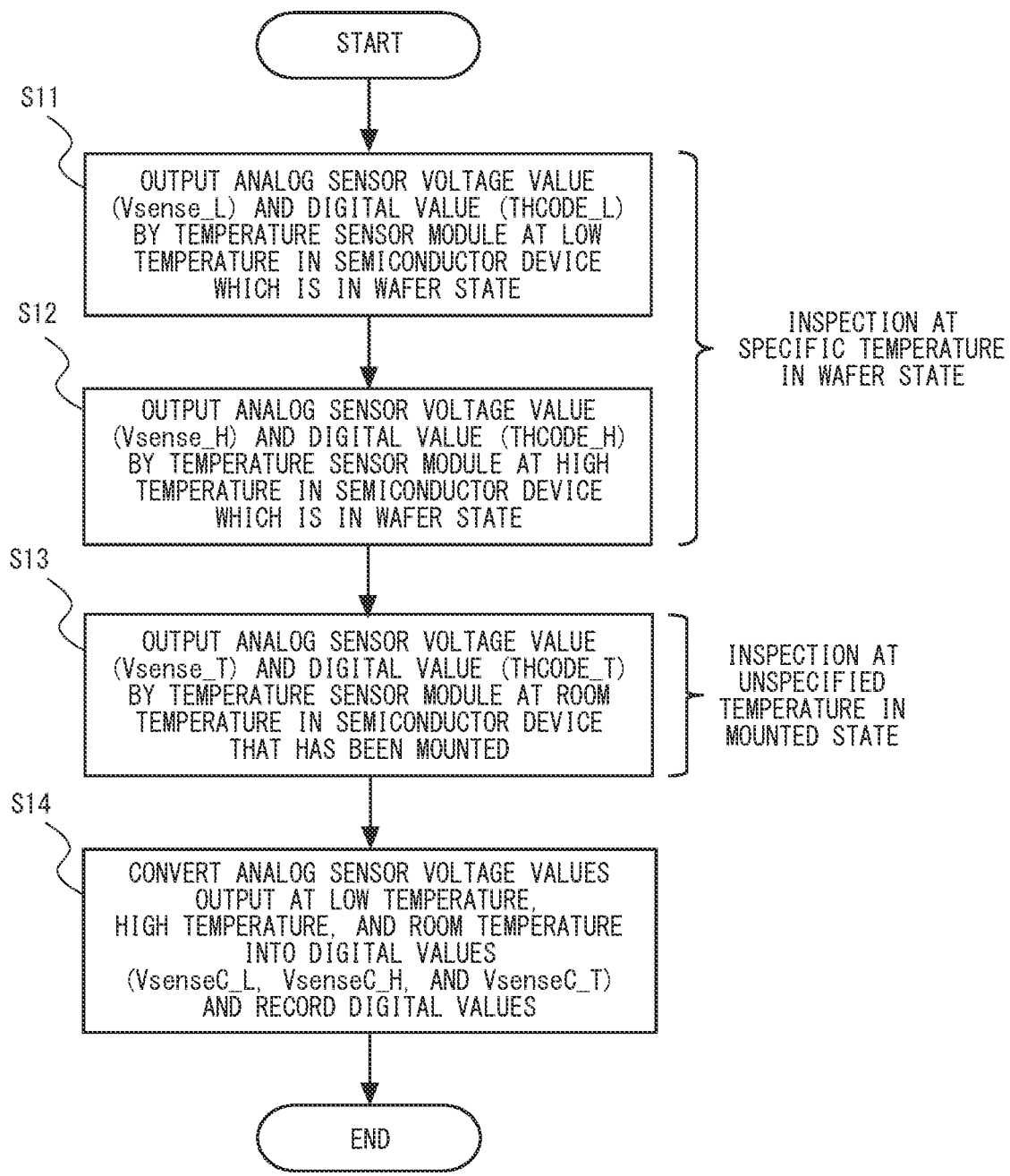
FIG. 5 is a flowchart that exemplifies a method of manufacturing the semiconductor device according to the first embodiment.

FIG. 5 is a flowchart that exemplifies the method of manufacturing the semiconductor device 1 according to the first embodiment. First, an inspection in the wafer state before the semiconductor device 1 is mounted on the printed board will be described. When the inspection in the wafer state is carried out, the temperature of the semiconductor device 1 can be directly measured. That is, the inspection in the wafer state is an inspection carried out under a circumstance in which the absolute temperature of the semiconductor device 1 can be measured. According to a temperature control of a manufacturing apparatus or the like on which the semiconductor device 1 is mounted, the characteristics of the semiconductor device 1 in the wafer state are inspected at a specific temperature. This inspection is performed, for example, in a wafer test process, a probe inspection process or the like.

Next, as shown in Step S11 in FIG. 5, the temperature of the semiconductor device 1 which is in the wafer state is set to a low temperature (first temperature) lower than the room temperature to cause the temperature sensor module 10 to output the analog sensor voltage value (Vsense_L) and the digital value (THCODE_L). Specifically, according to the temperature control of the manufacturing apparatus or the like, the temperature of the semiconductor device 1 is set to a temperature lower than the room temperature, e.g., −41° C. The low temperature environment in this case is an environment where the absolute temperature of the semiconductor device 1 can be directly measured. After the semiconductor device 1 is set to the low temperature, only the temperature sensor module 10 is controlled via the test module 20. In a normal operation after the semiconductor device 1 is mounted on the printed board, the controller 40, a phase locked loop (PLL) and the like operate, whereby a large current flows, noise is mixed into the ground (GND), or the ground is floated. However, by controlling only the temperature sensor module 10 via the test module 20 without operating the other modules, the measurement can be performed in a quiet state in which no noise is mixed into the ground.

As described above, at a low temperature, the analog sensor voltage value Vsense_L having the substantially linear characteristic with respect to the temperature output from the temperature sensor module 10 is measured and at the same time, the digital value THCODE_L having the non-linear characteristic with respect to the temperature output from the temperature sensor module 10 is measured.

Next, as shown in Step S12 in FIG. 5, in the semiconductor device 1 which is in the wafer state, the temperature is set to a temperature (second temperature) higher than the room temperature to cause the temperature sensor module 10 to output the analog sensor voltage value (Vsense_H) and the digital value (THCODE_H). Specifically, similar to the case of the low temperature, according to the temperature control of the manufacturing apparatus or the like, the high temperature of the semiconductor device 1 is set to a temperature higher than the room temperature (e.g., 96° C.). The high temperature environment in this case is an environment where the absolute temperature of the semiconductor device 1 can be directly measured. After the temperature of the semiconductor device 1 is set to the high temperature, only the temperature sensor module 10 is controlled through the test module 20. In this way, at the high temperature, the analog sensor voltage value Vsense_H having the substantially linear characteristic with respect to the temperature output from the temperature sensor module 10 is measured and, at the same time, the digital value THCODE_H having the non-linear characteristic with respect to the temperature output from the temperature sensor module 10 is measured.

The low temperature and the high temperature are not limited to −41° C. and 96° C. The low temperature is, for example, a temperature lower than a desired room temperature and includes, for example, temperatures from −41° C. to the room temperature. Further, in order to calculate the characteristic formula, the low temperature is preferably −40° C. to −20° C. Further, the high temperature is a temperature higher than the desired room temperature and includes, for example, temperatures from the room temperature to 150°. Further, in order to calculate the characteristic formula, the high temperature is preferably 96° C. to 150° C.

Next, the semiconductor device 1 is assembled as a package and is mounted on the printed board. After the semiconductor device 1 is mounted on the printed board, it becomes difficult to control the temperature from outside due to thermal resistance of the package, thermal diffusion to the printed board or the like. Further, after the semiconductor device 1 is mounted on the printed board, the absolute temperature of the semiconductor device 1 cannot be directly measured any more. However, it is possible to estimate the temperature of the temperature sensor 1 by measuring the sensor voltage value Vsense having the linear characteristic with respect to temperature using the test module 20. The measurement is performed at an unspecified temperature in the state in which the semiconductor device 1 is mounted on the printed board. The unspecified temperature is a temperature at which the direct measurement cannot be performed, unlike the measurement in Steps S11 and that in Step S12. The unspecified temperature is, for example, a desired room temperature.

As shown in Step S13 in FIG. 5, in the semiconductor device 1 mounted on the printed board, the analog sensor voltage value (Vsense_T) and the digital value (THCODE_T) are output by the temperature sensor module 10 at the room temperature. Specifically, the temperature of the semiconductor device 1 mounted on the printed board is set to the unspecified temperature (e.g., the room temperature). After the temperature of the semiconductor device 1 is set to the room temperature, only the temperature sensor module 10 is set through the test module 20. In this way, at the room temperature, the analog sensor voltage value Vsense_T having the substantially linear characteristic with respect to the temperature output from the temperature sensor module 10 is measured. At the same time, the digital value THCODE_T having the non-linear characteristic with respect to the temperature output from the temperature sensor module 10 is measured. At the room temperature, the voltage value Vref indicates the peak value of the arcuate characteristic. Therefore, it is possible to obtain the characteristic of the voltage value Vref by performing the measurement at the room temperature. This embodiment is not limited to the case in which the sensor voltage value Vsense_T and the digital value THCODE_T are measured at one point of the room temperature. The sensor voltage value Vsense_T and the digital value THCODE_T may be measured at a plurality of temperatures to acquire a plurality of values.

Next, as shown in Step S14 in FIG. 5, the analog sensor voltage values Vsense_L, Vsense_H, and Vsense_T output at the low temperature, the high temperature, and the room temperature are A/D converted into the digital values VsenseC_L, VsenseC_H, and VsenseC_T and the obtained values are recorded. This is because it is difficult to record the analog sensor voltage values. The total six values, that is, the sensor voltage value VsenseC_L, the sensor voltage value VsenseC_T, and the sensor voltage value VsenseC_H that have been digitized, the digital value THCODE_L, the digital value THCODE_T, and the digital value THCODE_H, are stored in the storage unit 30 (e.g., FUSE). The timing when the analog sensor voltage values are A/D converted and the timing when the values are recorded may be after the measurement at each temperature is performed.

As described above, the temperature, the digital value, and the sensor voltage value stored in the storage unit 30 include, for example, absolute temperature under the measurement of the absolute temperature, the digital value at the absolute temperature, and the sensor voltage value at the absolute temperature. The absolute temperature is the temperature output from the temperature sensor module 10 before the semiconductor device 1 is mounted on the printed board. That is, the storage unit 30 includes, in the environment where the absolute temperature of the semiconductor device 1 can be directly measured before the semiconductor device 1 is mounted on the printed board, the low temperature and the high temperature (absolute temperature) output from the temperature sensor module 10, the digital value THCODE_L at the low temperature and the digital value THCODE_H at the high temperature, and the sensor voltage value VsenseC_L at the low temperature and the sensor voltage value VsenseC_H at the high temperature. Further, the temperature, the digital value, and the sensor voltage value stored in the storage unit 30 include, in the environment where the absolute temperature of the semiconductor device 1 cannot be directly measured after the semiconductor device 1 is mounted on the printed board, the room temperature output from the temperature sensor module 10 (the room temperature that is higher than the low temperature and lower than the high temperature), the digital value THCODE_T at the room temperature, and the sensor voltage value VsenseC_T at the room temperature. The digital value THCODE_T is output from the temperature sensor module 10 together with the sensor voltage value VsenseC_T.

Then, after a predetermined process, the semiconductor device 1 according to the first embodiment is manufactured.

Figure 6:
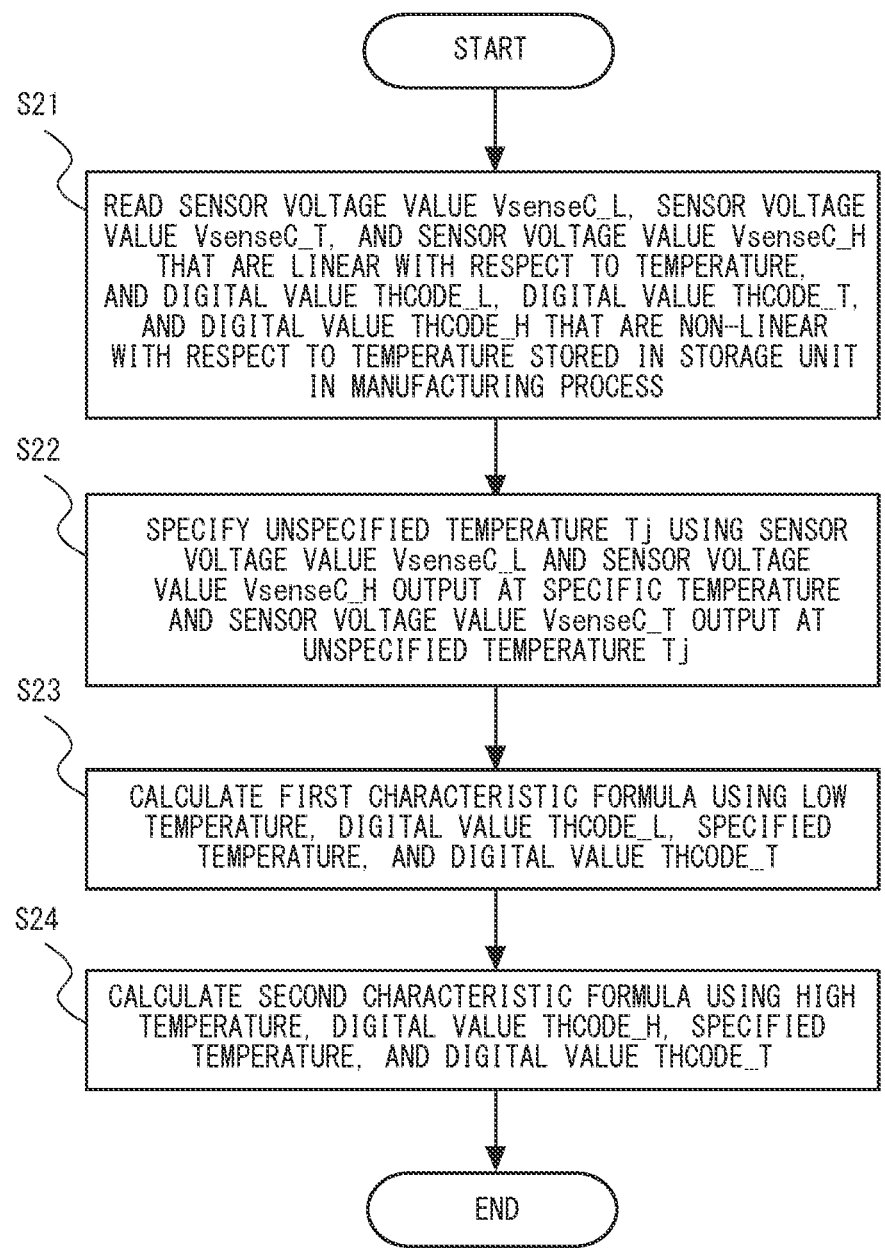
FIG. 6 is a flowchart that exemplifies an operation of the semiconductor device according to the first embodiment.

Next, an operation of the semiconductor device 1 according to the first embodiment will be described. FIG. 6 is a flowchart that exemplifies the operation of the semiconductor device 1 according to the first embodiment.

As shown in Step S21 in FIG. 6, the sensor voltage values that are substantially linear with respect to the temperature and the digital values that are non-linear with respect to the temperature stored in the storage unit 30 in the manufacturing process are read. To be more specific, first, after the semiconductor device 1 is started up, the controller 40 reads the sensor voltage value VsenseC_L, the sensor voltage value VsenseC_T, the sensor voltage value VsenseC_H, the digital value THCODE_L, the digital value THCODE_T, and the digital value THCODE_H recorded in the storage unit 30 in the manufacturing process via the register of the controller 40 and the register of the control logic 13 of the temperature sensor module 10.

Figure 7:
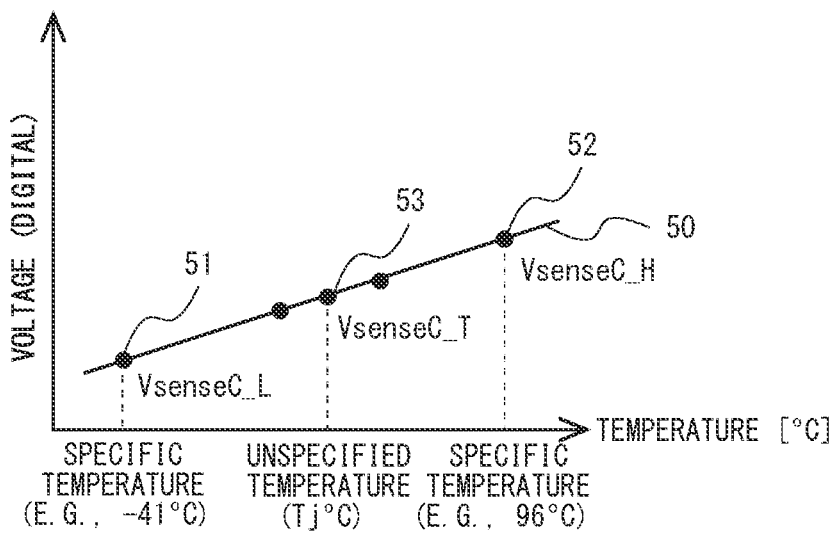
FIG. 7 is a diagram that exemplifies temperature characteristics of a sensor voltage value acquired in a process for manufacturing the semiconductor device according to the first embodiment, in which the horizontal axis indicates temperature and the vertical axis indicates the sensor voltage value.

FIG. 7 is a diagram that exemplifies the temperature characteristics of the sensor voltage value obtained in the process for manufacturing the semiconductor device 1 according to the first embodiment, in which the horizontal axis indicates the temperature and the vertical axis indicates the voltage value. As shown in FIG. 7, a characteristic 50 indicated by a sensor voltage value VsenseC_L (51), a sensor voltage value VsenseC_T (53), and a sensor voltage value VsenseC_H (52) that have been read indicates a substantially linear characteristic with respect to the temperature. The sensor voltage value VsenseC_T (53) is a sensor voltage value at an unspecified temperature. By plotting the sensor voltage value VsenseC_T (53) on the line indicated by the characteristic 50 calculated from the sensor voltage value VsenseC_L (51) and the sensor voltage value VsenseC_H (52) measured at a specified temperature, the unspecified temperature Tj can be specified. The thus specified temperature (third temperature) is calculated by substituting the sensor voltage value VsenseC_T (third sensor voltage value) into the substantially linear sensor characteristic formula calculated by the controller 40 using the low temperature (first temperature), the high temperature (second temperature), the sensor voltage value VsenseC_L (first sensor voltage value), and the sensor voltage value VsenseC_H (second sensor voltage value). While the unspecified temperature is the temperature of the room temperature, the temperature of the room temperature can be specified as described above.

As stated above, as shown in Step S22 in FIG. 6, the controller 40 specifies the unspecified temperature Tj using the sensor voltage value VsenseC_L and the sensor voltage value VsenseC_H output at the specific temperature, and the sensor voltage value VsenseC_T output at the unspecified temperature Tj.

Figure 8:
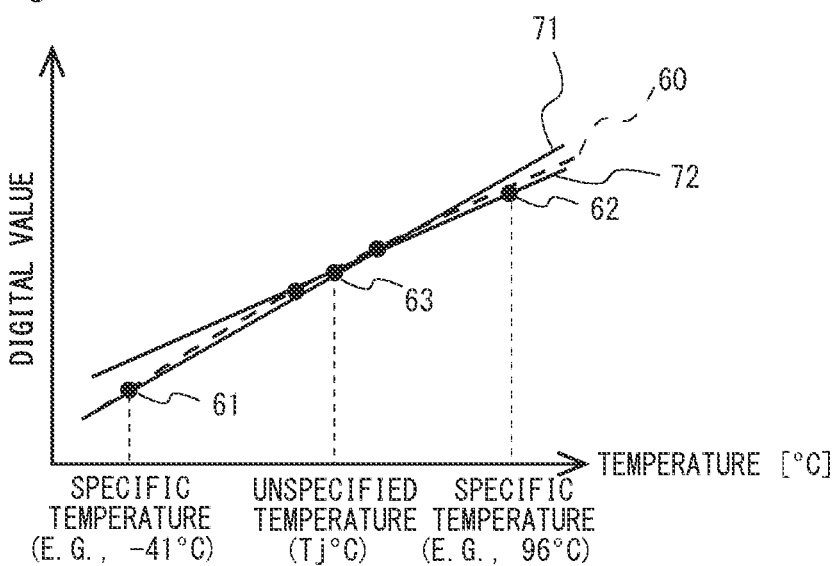
FIG. 8 is a diagram that exemplifies temperature characteristics of a digital value and characteristic formulae acquired in the process for manufacturing the semiconductor device according to the first embodiment, in which the horizontal axis indicates temperature and the vertical axis indicates the digital value.

FIG. 8 is a diagram that exemplifies the temperature characteristics of the digital value and characteristic formulae acquired in the process for manufacturing the semiconductor device 1 according to the first embodiment, in which the horizontal axis indicates the temperature and the vertical axis indicates the digital value. As shown in FIG. 8, since the characteristics of the digital value THCODE that has been read are temperature characteristics using the voltage value Vref and the sensor voltage value Vsense, it has an arcuate non-linear characteristic 60 having a peak at the room temperature. A digital value THCODE_L (61) at the low temperature, a digital value THCODE_H (62) at the high temperature, and THCODE_T (63) originally output at the unspecified temperature Tj are read. The unspecified temperature Tj is specified in Step S22.

As shown in Step S23 in FIG. 6, the controller 40 calculates a characteristic formula 71 (first characteristic formula) using the low temperature (first temperature), the digital value THCODE_L (61) (first digital value), the specified temperature (third temperature), and the digital value THCODE_T (63) (third digital value).

Further, as shown in Step S24 in FIG. 6, similar to the process in Step S23, the controller 40 calculates a characteristic formula (second characteristic formula) using the high temperature (second temperature), the digital value THCODE_H (62) (second digital value), the specified temperature (third temperature), and the digital value THCODE_T (63) (third digital value). When the digital value THCODE_T and the specified temperatures at two or more points are output, three or more characteristic formulae may be calculated.

The temperature sensor module 10 periodically measures the temperature. The temperature sensor module 10 outputs the temperature that has been measured as the digital value THCODE. The digital value THCODE that has been output is stored in the register of the control logic 13 in FIG. 1. The temperature of the semiconductor device 1 is monitored regularly or as needed. In this case, the controller 40 calculates, when the digital value THCODE output from the temperature sensor module 10 is smaller than the digital value THCODE_T (63) (third digital value), the temperature by substituting the digital value THCODE into the characteristic formula 71 (first characteristic formula).

On the other hand, when the digital value THCODE output from the temperature sensor module 10 is larger than the digital value THCODE_T (63) (third digital value), the temperature is calculated by substituting the digital value THCODE into the characteristic formula 72 (second characteristic formula). Specifically, the controller 40 such as a CPU reads the digital value THCODE and compares the digital value THCODE with the digital value THCODE_T (63) on software. When the digital value THCODE≤the digital value THCODE_T (63), the characteristic formula 71 is used. When the digital value THCODE≥the digital value THCODE_T (63), conversion into the temperature is performed using the characteristic formula 72. In this way, the controller 40 monitors the temperature of the semiconductor device 1.

Next, the effects of this embodiment will be described.

According to the semiconductor device 1 according to this embodiment, the digital values at the low temperature and the high temperature to calculate the characteristic formulae are calculated in the wafer state before the semiconductor device 1 is mounted on the printed board. The low temperature and the high temperature in the wafer state are the temperatures obtained by directly measuring the absolute temperature of the semiconductor device 1. It is therefore possible to calculate the characteristic formulae with high accuracy.

Further, the temperature and the digital value are stored in the storage unit 30. It is therefore possible to calculate the characteristic formulae by, for example, software when the semiconductor device 1 is started up.

While the temperature output from the temperature sensor module 10 may reflect the variations in the specific characteristics of the respective temperature sensor modules 10, since a characteristic formula is calculated separately for each of the temperature sensor modules 10, characteristic formulae in accordance with the variations in the specific characteristics can be obtained. It is therefore possible to measure the temperature and the power supply voltage with higher accuracy compared to the method of collectively adjusting the variations in the characteristics among the respective temperature sensor modules 10 by using the offset.

Further, it becomes possible to measure the temperature more rapidly than with the method of collectively correcting the characteristics of the respective temperature sensor modules 10. Further, when the non-linear characteristics are collectively corrected, the number of correction conditions and the amount of correction increase and exceed a correctable range. Therefore, according to the method of collectively correcting the linear characteristics, it is difficult to improve the accuracy.

Further, the temperature sensor module 10 includes the temperature detection circuit 14. The temperature detection circuit 14 outputs the sensor voltage value having the substantially linear characteristic with respect to the temperature. Accordingly, by using the substantially linear characteristic with respect to the temperature, it is possible to specify the unspecified temperature with high accuracy.

The temperature sensor module 10 digitizes and processes the sensor voltage value. Accordingly, it is possible to achieve high-speed processing. Further, since it is possible to quickly address the change in the temperature of the semiconductor device 1, it becomes possible to measure the temperature with high accuracy.

Modified Example 1

While the characteristic formula is calculated based on only one unspecified temperature Tj in the semiconductor device 1 according to the first embodiment, a semiconductor device according to Modified Example 1 in the first embodiment is not limited to the case in which only one unspecified temperature is used. When the number of unspecified temperatures is increased like unspecified temperatures $Tj\_1$, $Tj\_2, \ldots, Tj\_n$, it is possible to calculate the characteristic formula by which the correction can be performed with higher accuracy. In this way, the controller 30 of the semiconductor device according to Modified Example 1 specifies, from a plurality of desired sensor voltage values, a plurality of temperatures at which the temperature sensor module 10 outputs the plurality of desired sensor voltage values, to thereby calculate the characteristic formulae.

Modified Example 2

Next, the number of temperatures at which the sensor voltage value and the digital value are measured will be described. First, the number of temperatures at which the sensor voltage value is measured will be described. In the semiconductor device 1 according to the first embodiment, as shown in FIG. 7, two temperatures: the low temperature and the high temperature, have been set as the specific temperature at which the measurement is performed in the wafer state in the manufacturing process. Then the characteristic formula 50 has been calculated by measuring the sensor voltage value (VsenseC_L) (51) and the sensor voltage value (VsenseC_H) (52) at the low temperature and the high temperature. However, the number of temperatures is not limited thereto.

Figure 9:
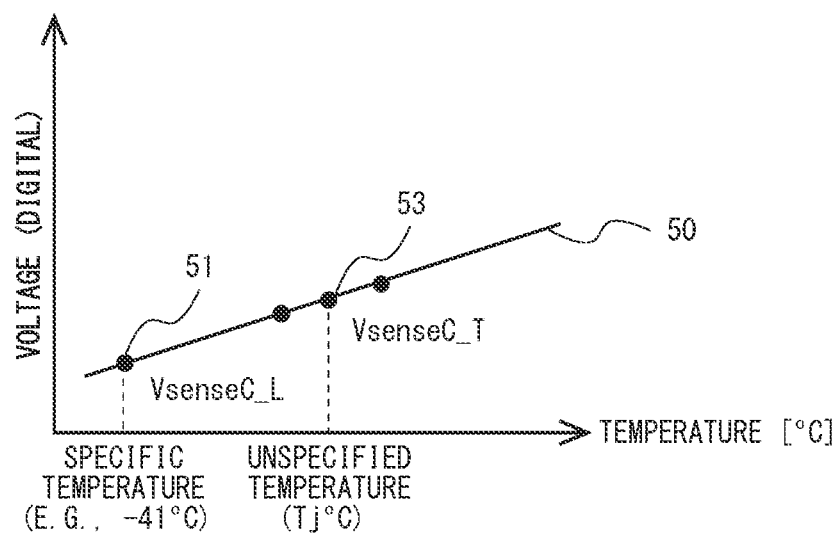
FIG. 9 is a diagram that exemplifies temperature characteristics of a sensor voltage value acquired in a process for manufacturing a semiconductor device according to Modified Example 2 of the first embodiment, in which the horizontal axis indicates temperature and the vertical axis indicates the sensor voltage value.

As shown in FIG. 9, in a semiconductor device according to Modified Example 2, temperature of one point at the low temperature may be, for example, set as the specific temperature at which the measurement is performed in the wafer state in the manufacturing process. The controller 40 may calculate the characteristic formula 50 from the low temperature and the sensor voltage value (VsenseC_L) (51) by measuring the sensor voltage value (VsenseC_L) (51) at the low temperature. In this case, the value of the tilt of the sensor voltage value (VsenseC) is stored in the storage unit 30 in advance. The tilt of the sensor voltage value (VsenseC) is stored in the storage unit 30 in advance by using, for example, data accumulated as a result of manufacturing a large number of semiconductor devices 1 or by using temperature dependency of the sensor voltage value (VsenseC) specific to the temperature detection circuit 14. Further, the storage unit 30 stores the low temperature (first temperature) and the sensor voltage value (first sensor voltage value) at the low temperature.

Modified Example 3

Figure 10:
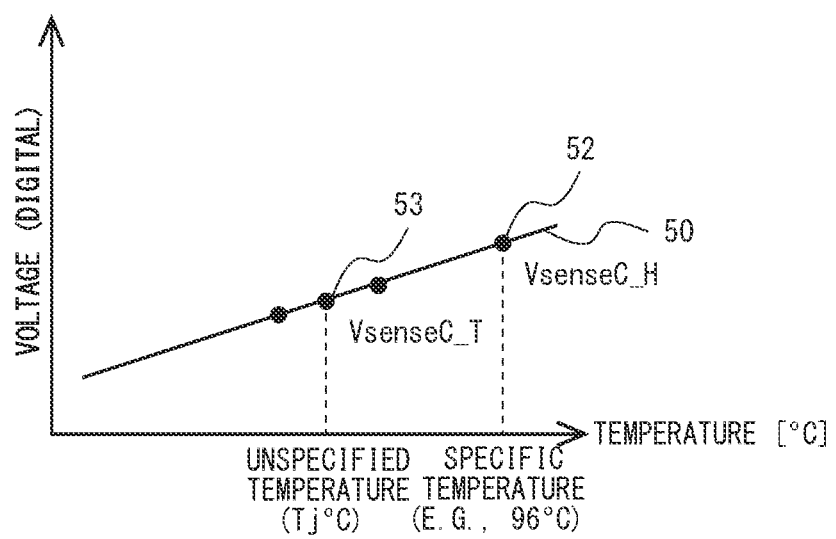
FIG. 10 is a diagram that exemplifies temperature characteristics of a sensor voltage value acquired in a process for manufacturing a semiconductor device according to Modified Example 3 of the first embodiment, in which the horizontal axis indicates temperature and the vertical axis indicates the sensor voltage value.

As shown in FIG. 10, in a semiconductor device according to Modified Example 3, temperature of one point at the high temperature may be, for example, set as the specific temperature at which the measurement is performed in the wafer state in the manufacturing process, and the sensor voltage value (VsenseC_H) (52) at the high temperature is measured, whereby the characteristic formula 50 is calculated. In this case as well, the value of the tilt of the sensor voltage value (VsenseC) is stored in the storage unit 30 in advance.

As described above, in the semiconductor devices according to Modified Examples 2 and 3, even when the number of specific temperatures at which the measurement is performed in the wafer state in the manufacturing process is one point, the characteristic formula 50 can be calculated. In the following process, similar to the aforementioned first embodiment, the semiconductor device according to each of Modified Examples 2 and 3 is assembled as a package and then mounted on the printed board. Then the controller 40 specifies the temperature at which the temperature sensor module 10 outputs a desired sensor voltage value from one specific temperature, the sensor voltage value at this temperature, and the desired sensor voltage value. Specifically, the temperature sensor module 10 substitutes the desired sensor voltage value into a characteristic formula to specify the desired temperature.

Modified Example 4

Next, the number of temperatures at which the digital value is measured will be described. In the first embodiment, as shown in FIG. 8, two temperatures: the low temperature and the high temperature, have been set as the specific temperature at which the measurement is performed in the wafer state in the manufacturing process. Then the digital value THCODE_L (61) and the digital value THCODE_H (62) at the low temperature and the high temperature are measured and these values are combined with the digital value THCODE_T (63) at the room temperature to calculate the characteristic formulae 71 and 72. However, the number of temperatures is not limited thereto.

Figure 11:
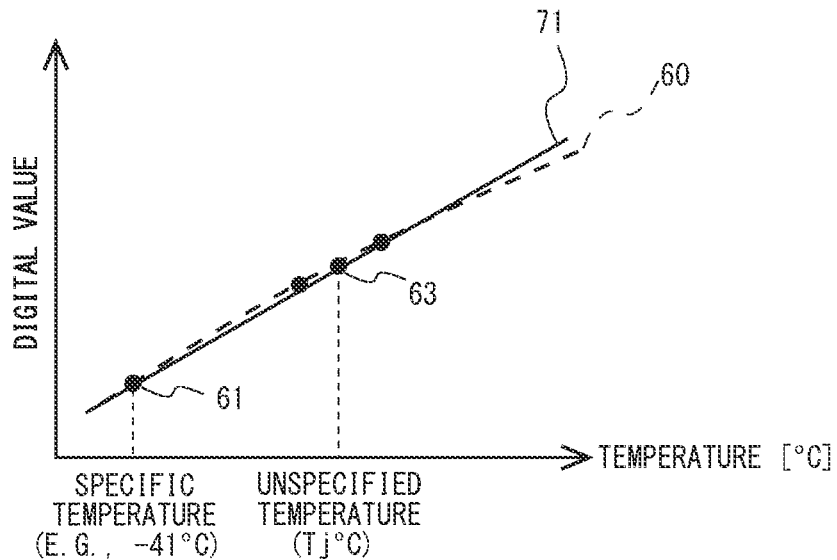
FIG. 11 is a diagram that exemplifies temperature characteristics of a digital value and a characteristic formula acquired in a process for manufacturing a semiconductor device according to Modified Example 4 of the first embodiment, in which the horizontal axis indicates temperature and the vertical axis indicates the digital value.

As shown in FIG. 11, in a semiconductor device according to Modified Example 4, temperature of one point at the low temperature may be, for example, set as the specific temperature at which the measurement is performed in the wafer state in the manufacturing process. The controller 40 measures the digital value THCODE_L (61) at the low temperature. Then the characteristic formula 71 may be calculated by using this value together with the digital value THCODE_T (63) at the room temperature measured after the semiconductor device 1 is mounted on the printed board.

Modified Example 5

Figure 12:
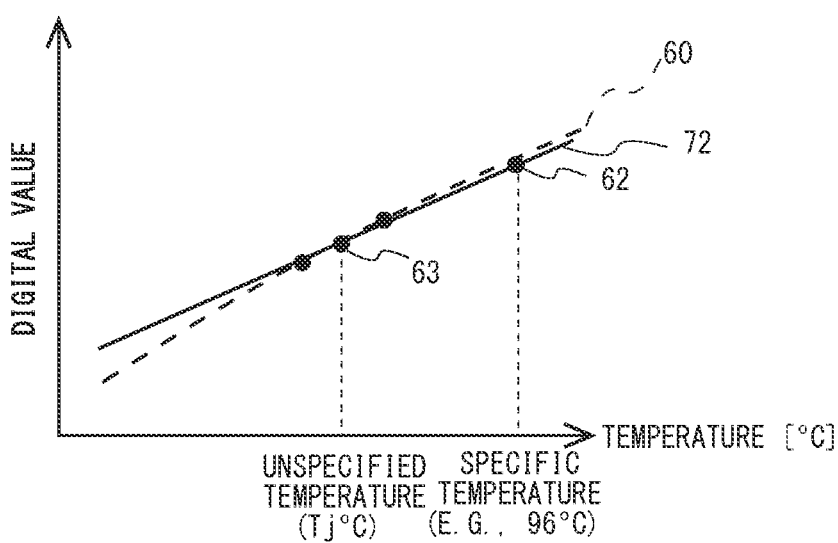
FIG. 12 is a diagram that exemplifies temperature characteristics of a digital value and a characteristic formula acquired in a process for manufacturing a semiconductor device according to Modified Example 5 of the first embodiment, in which the horizontal axis indicates temperature and the vertical axis indicates the digital value.

Further, as shown in FIG. 12, in a semiconductor device according to Modified Example 5, temperature of one point at the high temperature may be, for example, set as the specific temperature at which the measurement is performed in the wafer state in the manufacturing process. The controller 40 measures the digital value THCODE_H (62) at the high temperature. Then, the characteristic formula 72 may be calculated by using this value together with the digital value THCODE_T (63) at the room temperature measured after the semiconductor device 1 is mounted on the printed board.

Modified Example 6

Further, the number of specific temperatures at which the measurement is performed in the wafer state in the manufacturing process may be three or larger. In this case, three or more temperatures may include one or both of the low temperature and the high temperature.

Figure 13:
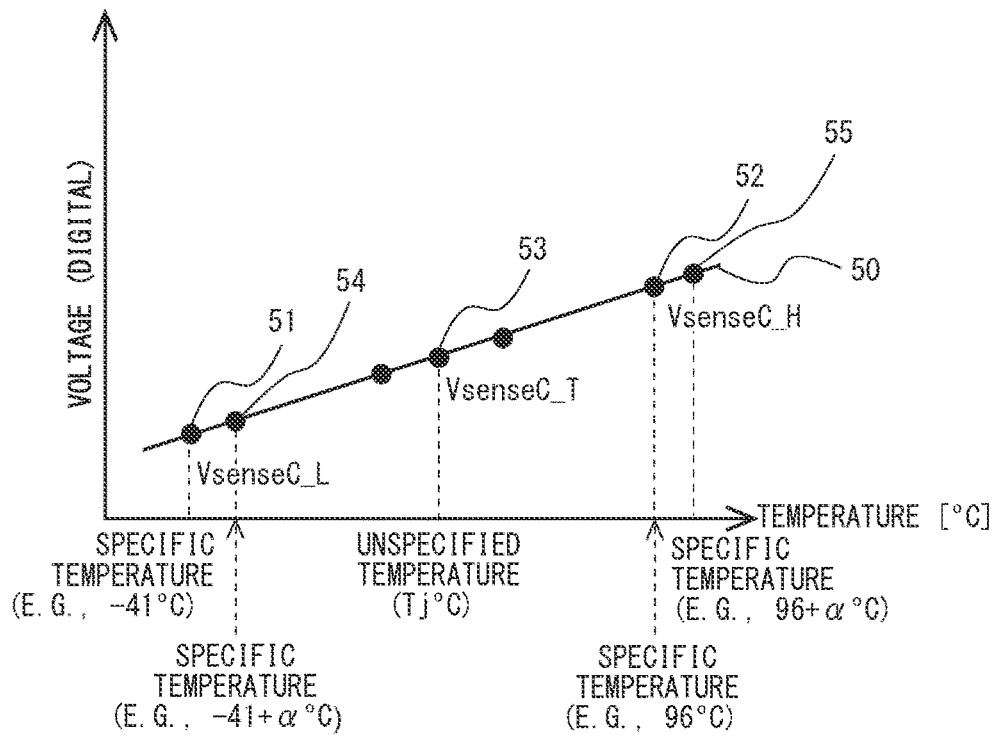
FIG. 13 is a diagram that exemplifies temperature characteristics of a sensor voltage value acquired in a process for manufacturing a semiconductor device according to Modified Example 6 of the first embodiment, in which the horizontal axis indicates temperature and the vertical axis indicates the sensor voltage value.

As shown in FIG. 13, in a semiconductor device according to Modified Example 6, temperatures at four points: a specific temperature (−41° C.), a specific temperature (−41+α° C.), a specific temperature (96° C.), and a specific temperature (96+α° C.) may be, for example, set as the specific temperature at which the measurement is performed in the wafer state in the manufacturing process and the characteristic formula 50 may be calculated by measuring sensor voltage values (VsenseC) 51, 54, 52, and 55 corresponding to the respective temperatures. In this case, the storage unit 30 further stores three or more plurality of temperatures including the first temperature and the sensor voltage values corresponding to the plurality of respective temperatures, and the controller 40 specifies the temperature at which the temperature sensor module 10 outputs a desired sensor voltage value from the plurality of temperatures, the sensor voltage values corresponding to the plurality of respective temperatures, and the desired sensor voltage value to calculate the characteristic formula. It is therefore possible to measure the temperature and the power supply voltage with high accuracy.

Modified Example 7

Figure 14:
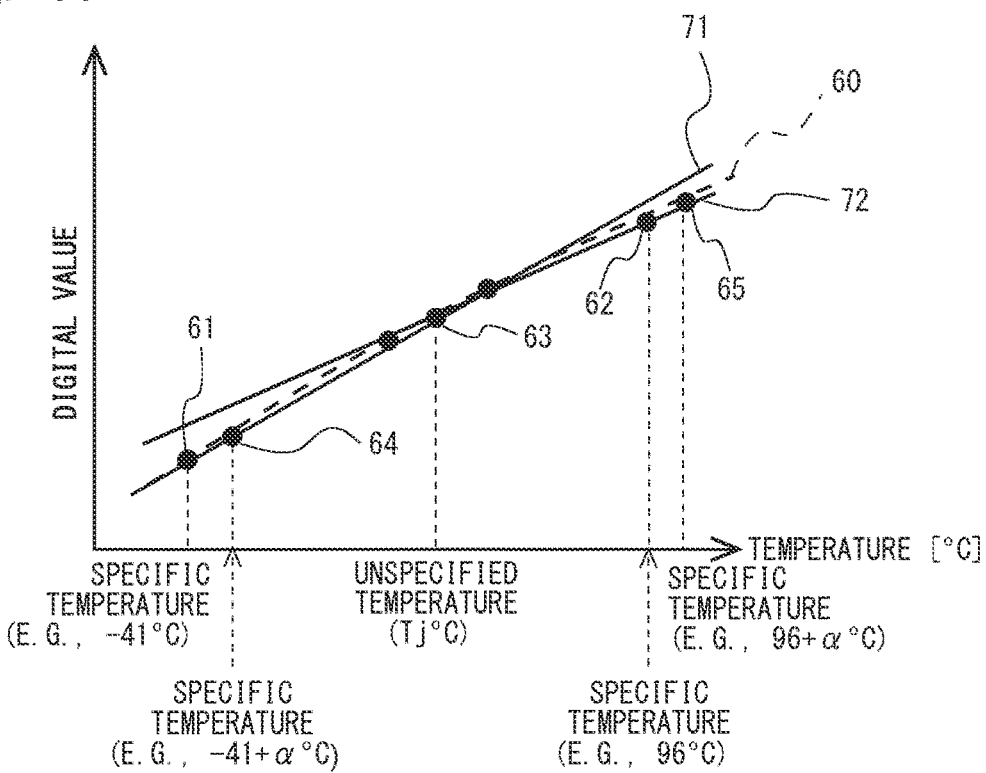
FIG. 14 is a diagram that exemplifies temperature characteristics of a digital value and a characteristic formula acquired in a process for manufacturing a semiconductor device according to Modified Example 7 of the first embodiment, in which the horizontal axis indicates temperature and the vertical axis indicates the digital value.

Further, as shown in FIG. 14, in the semiconductor device according to Modified Example 7, temperatures at four points may be set as the specific temperature at which the measurement is performed in the wafer state in the manufacturing process, similar to FIG. 13 and digital values (THCODE) 61, 64, 62, and 65 corresponding to the respective temperatures are measured. Then the digital value THCODE_T (63) at the room temperature measured after the semiconductor device is mounted on the printed board is measured. The controller 40 may calculate the characteristic formulae 71 and 72 from the temperatures at the four points, the digital values corresponding to the respective temperatures at four points, and the digital value THCODE_T (63) at the room temperature. By performing these calculations, the temperature and the power supply voltage may be measured with high accuracy. A plurality of characteristic formulae may be calculated.

Second Embodiment

Next, a semiconductor device according to a second embodiment will be described. When the temperature sensor module 10 is used for a long period of time, the analog characteristics are changed due to changes over time. Accordingly, in order to keep the measurement of the temperature Tj of the semiconductor device 1 with high accuracy in a guaranteed life time (e.g., 7 to 15 years) of the semiconductor device 1, it is required to correct the temperature characteristics of the temperature sensor module 10 due to the changes over time. This embodiment addresses the problem of the temperature characteristics due to the changes over time.

Figure 15:
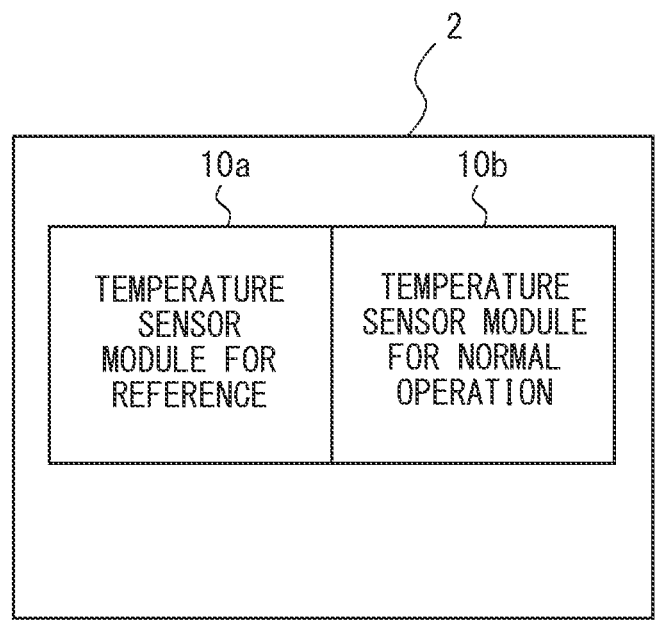
FIG. 15 is a configuration diagram that exemplifies a semiconductor device according to a second embodiment.

FIG. 15 is a configuration diagram that exemplifies a semiconductor device 2 according to the second embodiment. As shown in FIG. 15, the semiconductor device 2 according to this embodiment includes a plurality of temperature sensor modules 10a and 10b. When the semiconductor device 2 is started up, a temperature sensor module 10a for a reference (one temperature sensor module) and a temperature sensor module 10b for a normal operation (another temperature sensor module) that are adjacent to each other are operated. After the semiconductor device 2 is started up, the temperature sensor module 10a for the reference stops the operation and the temperature sensor module 10b for the normal operation keeps the operation. While the semiconductor device 2 includes other modules such as the storage unit 30 and the controller 40, they are not shown in FIG. 15.

By arranging the temperature sensor module 10a for the reference and the temperature sensor module 10b for the normal operation adjacent to each other, both the modules 10a and 10b are able to measure substantially the same temperature Tj.

Since a method similar to the method of manufacturing the temperature sensor module 10 of the semiconductor device 1 according to the first embodiment or the semiconductor devices according to Modified Examples 1 to 7 is applied to each of the temperature sensor modules of the semiconductor device 2, descriptions of the method of manufacturing the semiconductor device 2 according to the second embodiment will be omitted.

Figure 16:
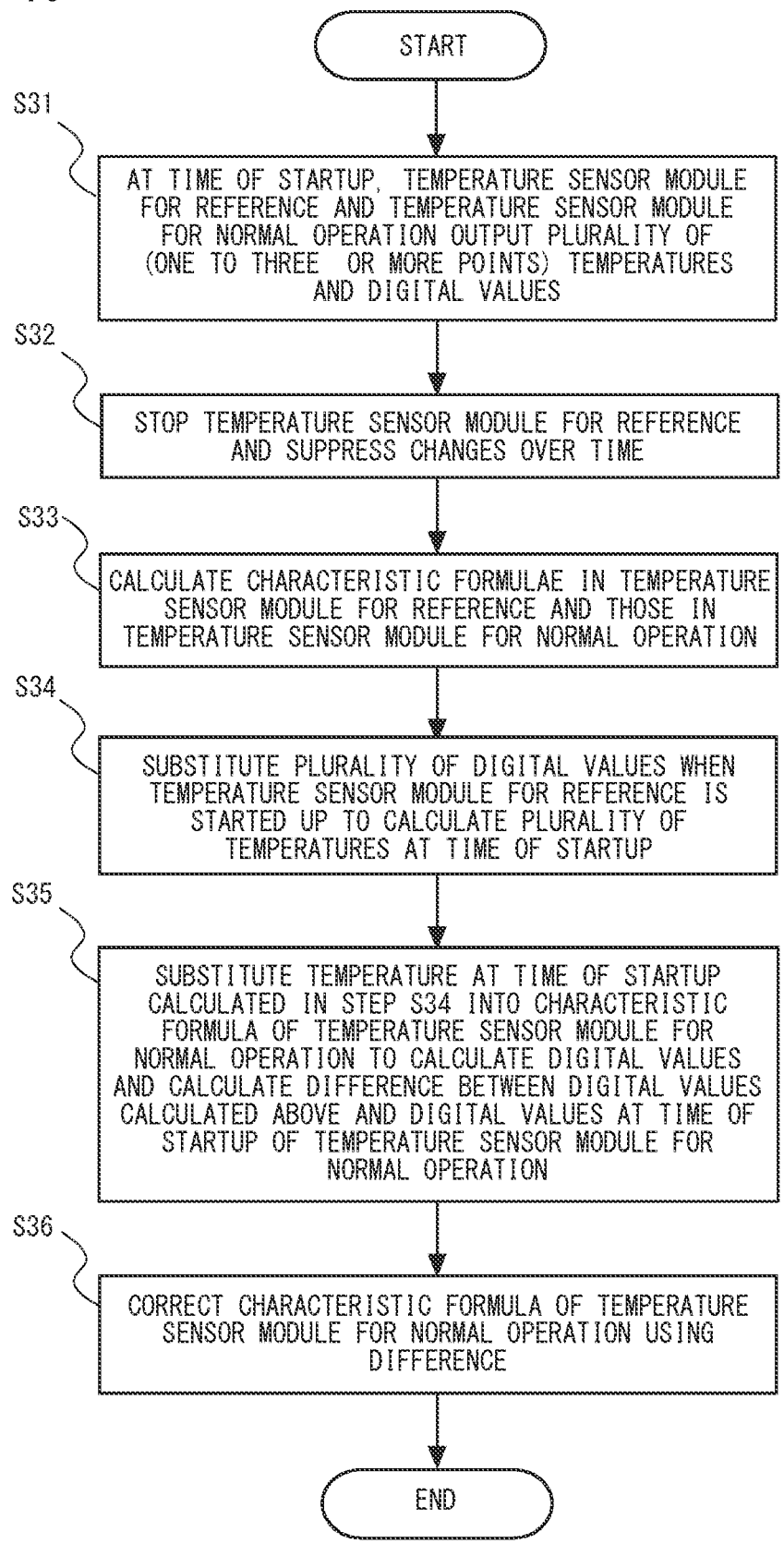
FIG. 16 is a flowchart that exemplifies an operation of the semiconductor device according to the second embodiment.

Next, an operation of the semiconductor device 2 according to the second embodiment will be described. FIG. 16 is a flowchart that exemplifies the operation of the semiconductor device 2 according to the second embodiment.

Figure 17:
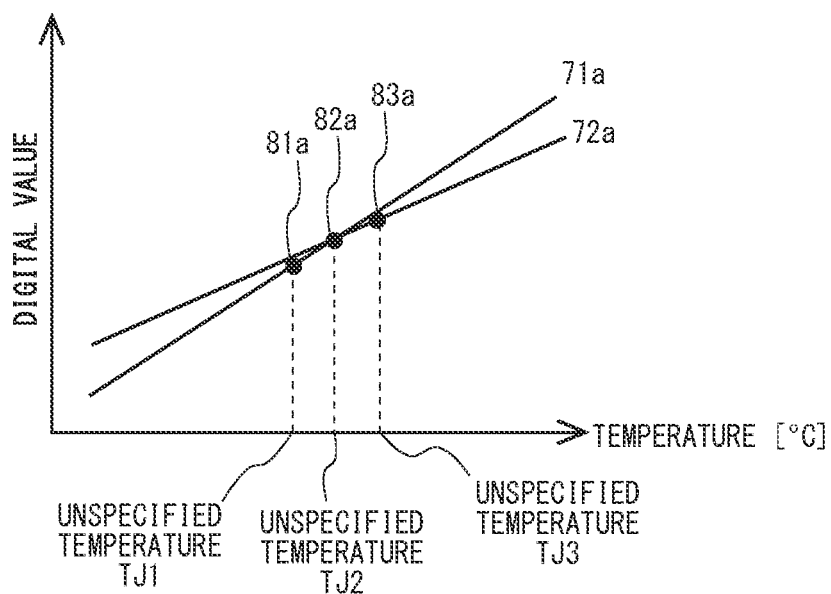
FIG. 17 is a graph that exemplifies a digital value output from a temperature sensor module for a reference of the semiconductor device according to the second embodiment at a time of startup, in which the horizontal axis indicates temperature and the vertical axis indicates the digital value.
Figure 18:
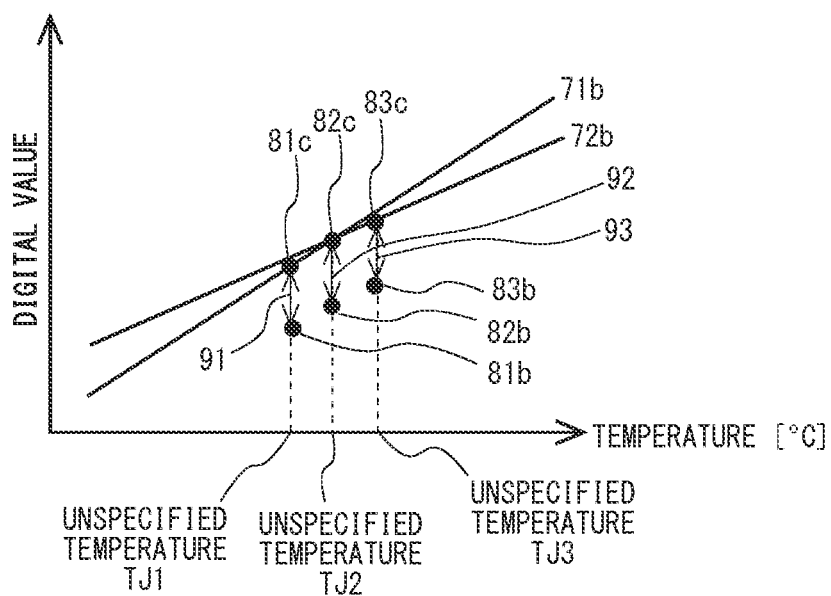
FIG. 18 is a graph that exemplifies a digital value output from a temperature sensor module for a normal operation of the semiconductor device according to the second embodiment at the time of startup, in which the horizontal axis indicates temperature and the vertical axis indicates the digital value.

FIG. 17 is a graph that exemplifies a digital value output from the temperature sensor module 10a for the reference of the semiconductor device 2 according to the second embodiment at the time of startup, in which the horizontal axis indicates the temperature and the vertical axis indicates the digital value. FIG. 18 is a graph that exemplifies a digital value output from the temperature sensor module 10b for the normal operation of the semiconductor device 2 according to the second embodiment at the time of startup, in which the horizontal axis indicates the temperature and the vertical axis indicates the digital value.

As shown in Step S31 in FIG. 16 and FIG. 17, when the semiconductor device 2 is started up, the temperature sensor module 10a for the reference outputs a plurality of temperatures and a plurality of digital values 81a, 82a, and 83a (first startup digital values) at the time of startup.

As shown in Step S31 in FIG. 16 and FIG. 18, when the semiconductor device 2 is started up, the temperature sensor module 10b for the normal operation outputs a plurality of temperatures and a plurality of digital values 81b, 82b, and 83b (second startup digital values) at the time of startup. Specifically, when the semiconductor device 2 is started up, the temperature of the semiconductor device 2 is basically increased due to the operation of the controller 40 such as a CPU. By using this increase in the temperature, the temperature sensor module 10a for the reference and the temperature sensor module 10b for the normal operation output, for example, the temperatures and the digital values at one to three or more points.

As shown in FIG. 17, the temperatures and the digital values at three or more points in the temperature sensor module 10a for the reference are, for example, the digital value 81a at an unspecified temperature TJ1, the digital value 82a at an unspecified temperature TJ2, and the digital value 83a at an unspecified temperature TJ3.

As shown in FIG. 18, the temperatures and the digital values at three or more points in the temperature sensor module 10b for the normal operation are, for example, the digital value 81b at the unspecified temperature TJ1, the digital value 82b at the unspecified temperature TJ2, and the digital value 83b at the unspecified temperature TJ3. As stated above, since the temperature sensor module 10a for the reference and the temperature sensor module 10b for the normal operation are adjacent to each other, the unspecified temperatures TJ1 to TJ3 in the temperature sensor module 10a and the unspecified temperatures TJ1 to TJ3 in the temperature sensor module 10b are substantially the same temperatures. The temperature and the digital value that have been output are stored in the register of the control logic 13 of the temperature sensor module 10, the register of the controller 40 and the like.

Next, as shown in Step S32 in FIG. 16, after the semiconductor device 2 is started up and the plurality of (three or more points) digital values at the unspecified temperature Tj are output, the temperature sensor module 10a for the reference is stopped in order to suppress changes over time. This stopping operation is performed by, for example, interrupting power supplied to the temperature sensor module 10a or controlling the controller 40. The stop of the temperature sensor module 10a for the reference includes stop of the analog unit that performs temperature measurement or the like. This aims to suppress changes over time of the analog unit.

Next, as shown in Step S33 in FIG. 16, using the aforementioned method in the first embodiment or Modified Examples 1 to 7, the controller 40 calculates the characteristic formulae 71a and 72a in the temperature sensor module 10a for the reference and the characteristic formulae 71b and 72b in the temperature sensor module 10b for the normal operation. The characteristic formulae 71a, 71b, 72a, and 72b are calculated, for example, using the digital value that is output at the room temperature in advance when, for example, the product is shipped. The timing when the product is shipped means the timing when the product is subjected to an operation test in the manufacturing process.

Next, as shown in Step S34 in FIG. 16, the controller 40 calculates the plurality of temperatures (first startup temperatures) at the time of startup by substituting the plurality of digital values (first startup digital values) when the temperature sensor module 10a for the reference is started up into the characteristic formula 71a or 72a of the temperature sensor module 10a. Specifically, as shown in FIG. 17, the temperature sensor module 10a for the reference specifies the temperatures TJ1 to TJ3 by substituting the digital values 81a to 83a into the characteristic formula 71a or 72a. Whether to use the characteristic formula 71a or 72a is determined based on the magnitude relation with respect to the reference digital value, as described above.

Next, as shown in Step S35 in FIG. 16 and FIG. 18, by substituting the plurality of temperatures at the time of startup calculated in Step S34 into the characteristic formula 71b or 72b of the temperature sensor module 10b for the normal operation, the plurality of digital values 81c to 83c (third startup digital values) are calculated. Then the differences 91 to 93 between the digital values 81c to 83c and the digital values 81b to 83b at the plurality of respective temperatures are calculated.

The temperature sensor module 10a for the reference and the temperature sensor module 10b for the normal operation are arranged adjacent to each other. Therefore, the actual temperature of the temperature sensor module 10a and that of the temperature sensor module 10b are substantially the same. Accordingly, the temperature output from the temperature sensor module 10a and the temperature output from the temperature sensor module 10b should be substantially the same. The digital values 81c to 83c obtained by substituting the plurality of temperatures TJ1 to TJ3 at the time of startup calculated by the temperature sensor module 10a for the reference into the characteristic formula 71b or 72b of the temperature sensor module 10b for the normal operation should be substantially the same as the digital values 81b to 83b output from the temperature sensor module 10b for the normal operation at the time of startup. However, when there are changes over time or the like in the temperature sensor module 10b, there may be differences 91 to 93 between the digital values 81c to 83c and the digital values 81b to 83b. Thus, these differences are calculated.

Next, as shown in Step S36, the controller 40 corrects at least one of the characteristic formulae 71b and 72b of the temperature sensor module 10b for the normal operation using the differences that have been calculated. Further, the controller 40 corrects the power supply voltage output from the power supply voltage monitor unit 12 using the differences 91 to 93. The correction specifically indicates, for example, addition of the difference to the characteristic formula at the time of shipping or subtraction of the difference from the characteristic formula at the time of shipping.

The temperature of the semiconductor device 2 is monitored using the characteristic formulae 71b and 72b that have been corrected.

Next, the effects of the second embodiment will be described.

According to the semiconductor device 2 in the second embodiment, by arranging the temperature sensor module 10a for the reference and the temperature sensor module 10b for the normal operation adjacent to each other, both the modules 10a and 10b can measure substantially the same temperature.

At the time of startup, the temperature sensor module 10a for the reference and the temperature sensor module 10b for the normal operation output a plurality of (at least one to three points) digital values with respect to the unspecified temperatures TJ1 to TJ3 at the same time. The difference is calculated from the digital value that has been output and the characteristic formula is corrected from the difference that has been calculated. Since the difference reflects changes over time, the changes over time can be corrected according to this correction. It is therefore possible to measure the temperature with high accuracy in the guaranteed life time of the semiconductor device 2.

Further, when the power supply voltage in the semiconductor device 2 is measured, the correction of the changes over time using the difference is performed, whereby it is possible to measure the power supply voltage with high accuracy in the guaranteed life time of the semiconductor device 2. The other effects are similar to those in the first embodiment and Modified Examples 1 to 7.

Third Embodiment

Figure 19:
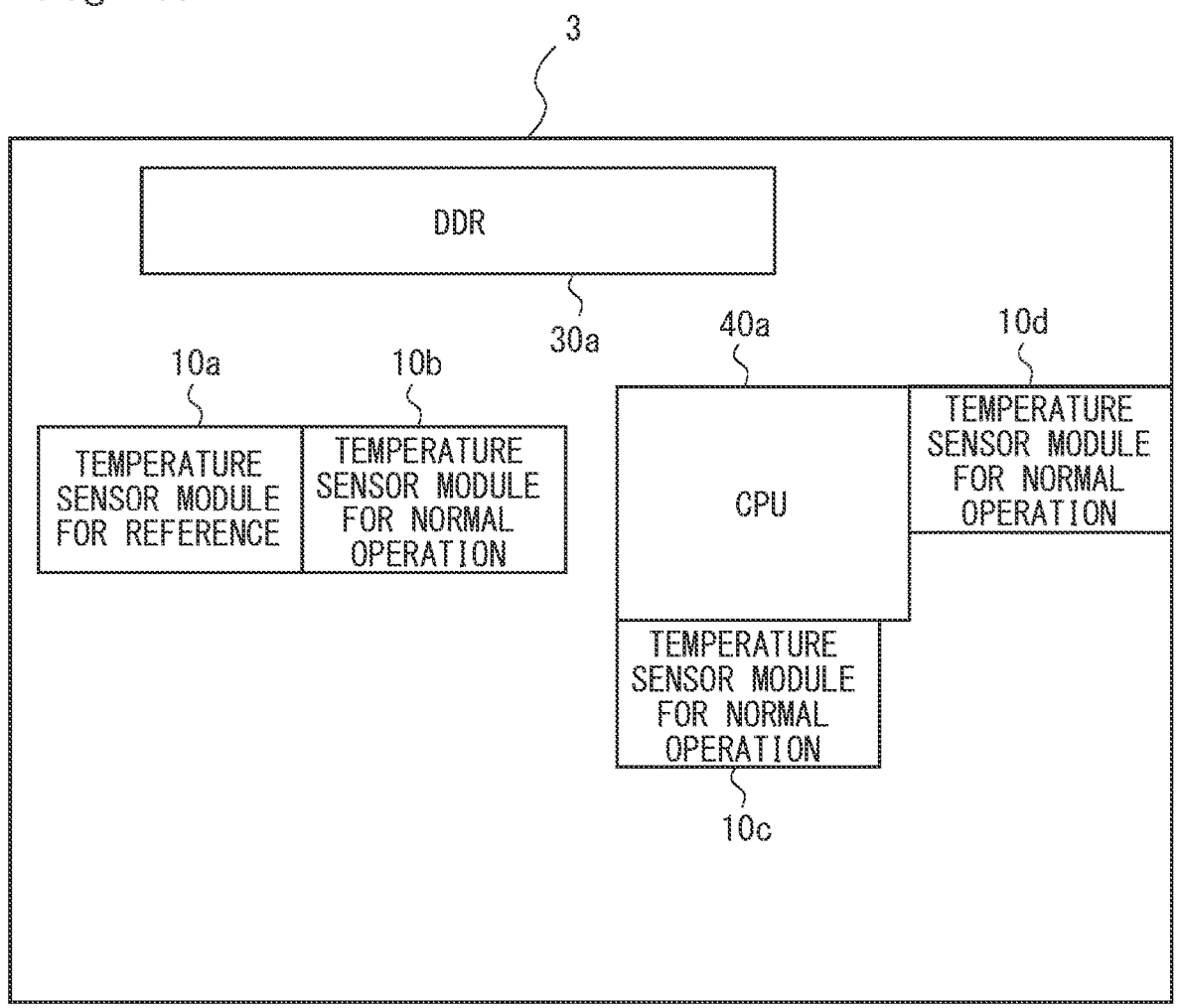
FIG. 19 is a configuration diagram that exemplifies a semiconductor device according to a third embodiment.

Next, a semiconductor device 3 according to a third embodiment will be described. In the third embodiment, besides the temperature sensor module for the reference and the temperature sensor module for the normal operation, one or more temperature sensor modules are arranged in the semiconductor device 3, and correction is performed for these temperature sensor modules using the difference. FIG. 19 is a configuration diagram that exemplifies the semiconductor device 3 according to the third embodiment.

As shown in FIG. 19, the semiconductor device 3 includes, besides the temperature sensor module 10a for the reference and the temperature sensor module 10b for the normal operation, temperature sensor modules 10c and 10d (other temperature sensor modules). The temperature sensor module 10a for the reference and the temperature sensor module 10b for the normal operation are arranged adjacent to each other. The other plurality of temperature sensor modules 10c and 10d are arranged near the CPU 40a whose temperature is apt to increase in the semiconductor device 3. They are arranged near the CPU 40a in order to improve the accuracy of the power supply voltage as well.

As the method of manufacturing the semiconductor device 3 according to the third embodiment, a method similar to the method of manufacturing the temperature sensor module 10 of the semiconductor device 1 according to the first embodiment or the semiconductor devices according to Modified Examples 1 to 7 is applied to each of the temperature sensor modules 10a to 10d of the semiconductor device 3. Further, the CPU 40a, an interface to a Double-Data-Rate Synchronous Dynamic Random Access Memory (DDR) 30a or the like are provided. After that, the semiconductor device 3 is manufactured through a predetermined process.

Next, an operation of the semiconductor device 3 according to the third embodiment will be described. At least one of the first characteristic formula and the second characteristic formula in each of the temperature sensor modules 10c and 10d is corrected using the difference calculated in the aforementioned second embodiment. Then each of the temperature sensor modules 10c and 10d converts the digital value into the temperature using the characteristic formula that has been corrected. The changes over time vary depending on the separate characteristic, the operating condition or the like of each of the temperature sensor modules. It is therefore preferable to correct the characteristic formula in consideration of the changes over time every time the semiconductor device 3 is started up. Further, each of the temperature sensor modules serves as a power supply voltage monitor. Each of the power supply voltage monitors corrects the digital value as a power supply voltage using the difference and outputs the corrected value.

Next, the effects of the third embodiment will be described.

According to the semiconductor device 3 in this embodiment, the characteristic formula of each of the temperature sensor modules is corrected by applying the difference due to changes over time calculated in the second embodiment to each of the temperature sensor modules. Since it is considered that the temperature sensor modules in the semiconductor device 3 have been changed substantially in the same way over time, by applying the difference calculated by the temperature sensor module 10a and the temperature sensor module 10b to each characteristic formula specific to each temperature sensor module, changes over time can be corrected with respect to the characteristics of the respective temperature sensor modules. It is therefore possible to measure the temperature and the power supply voltage with high accuracy.

Further, since it is considered that the temperature sensor modules in the semiconductor device 3 have been changed substantially in the same way over time, it is sufficient that at least one pair of the temperature sensor module for the reference and the temperature sensor module for the normal operation that are arranged adjacent to each other be provided. Accordingly, the temperature sensor modules 10c and 10d for the reference are not necessary, whereby it is possible to reduce the space in the semiconductor device 3 and to miniaturize the semiconductor device 3.

Figure 20:
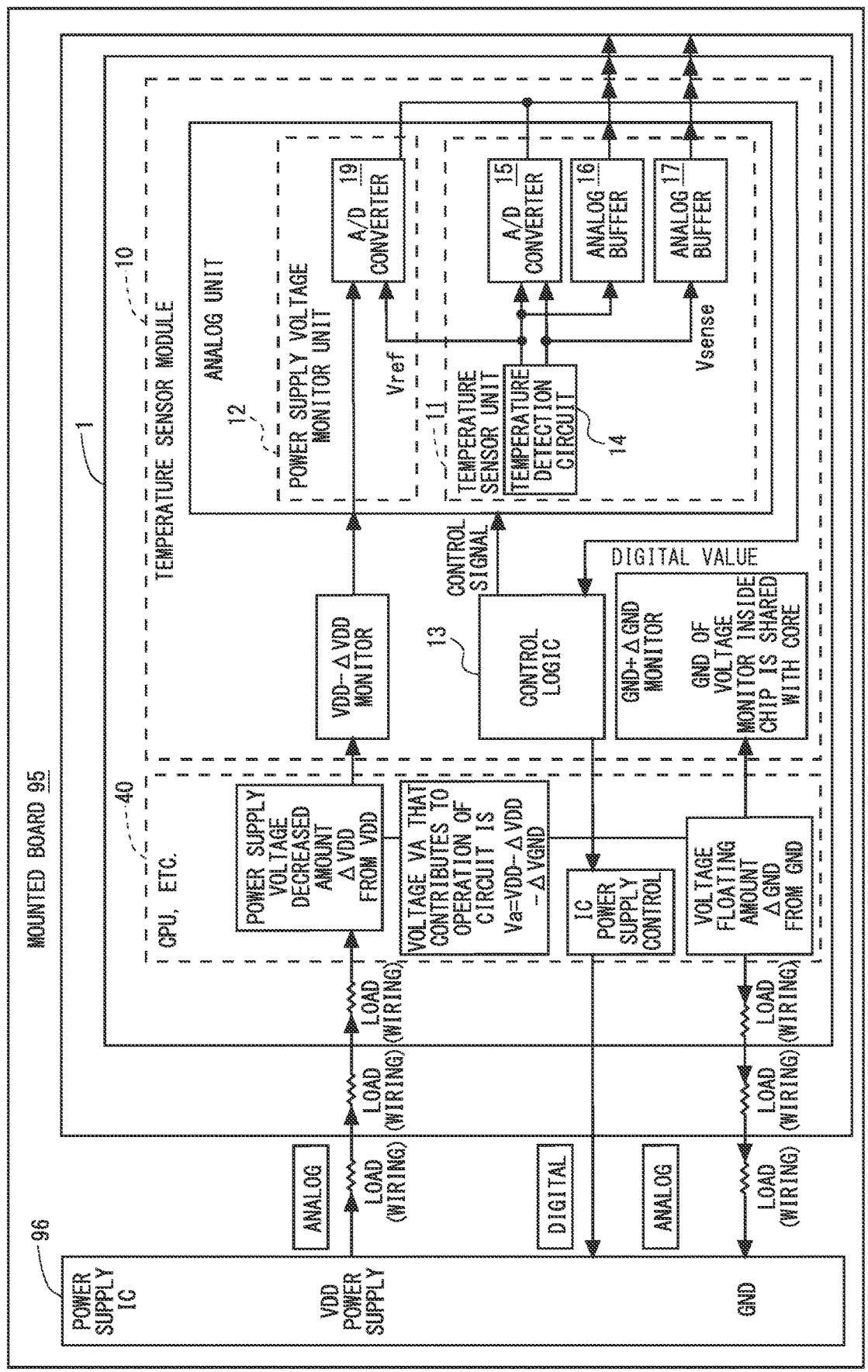
FIG. 20 is a diagram that exemplifies a relation between a temperature sensor module and control of a power supply IC.

Next, the relation between the temperature sensor module and the control of the power supply IC will be described. FIG. 20 is a diagram that exemplifies a relation between the temperature sensor module 10 and control of a power supply IC 96. As stated above, the power supply voltage monitor unit 12 is provided in the temperature sensor module 10. Accordingly, the temperature sensor module 10 not only serves as the temperature sensor but also serves as a power supply voltage monitor.

The power supply IC 96 is provided in a mounted board 95 on which the semiconductor device 1 is provided. The power supply IC 96 supplies a power supply voltage that has been reduced to the target voltage to the semiconductor device 1. A load due to wiring or the like is applied while a voltage reaches the power supply voltage monitor unit 12 from the power supply IC 96. Accordingly, the power supply voltage VDD is reduced by a decreased amount ΔVDD. On the other hand, a load due to wiring or the like is applied while a voltage reaches the power supply voltage monitor unit 12 from the ground of the power supply IC 96. Accordingly, the voltage is increased by a floating amount ΔGND of the ground voltage. Accordingly, in the power supplied to the power supply voltage monitor unit 12, the power supply voltage VDD (this voltage is also called an internal voltage) of the semiconductor device 1 becomes equal to the voltage obtained by subtracting the decreased amount ΔVDD and the floating amount ΔGND.

In the power supply voltage monitor unit 12, the power supply voltage VDD(+ΔVDD−ΔGND) in the semiconductor device 1 and the voltage value Vref are combined with each other and the combined value is converted into a digital value as a power supply voltage monitor by the A/D converter 19. The digital value after the conversion is monitored in the control logic 13 whether this value is an appropriate power supply voltage. The controller 40 further corrects and monitors the digital value using the difference in which changes over time are taken into consideration as described in the second embodiment. The control logic 13 outputs the power supply voltage that has been monitored to the controller 40. In some cases, the controller 40 operates an IC power supply control function when necessary to control the power supply of the power supply IC 96.

While the present invention made by the present inventors has been specifically described based on the embodiments, it is needless to say that the present invention is not limited to the embodiments stated above and various changes may be made on the present invention without departing from the spirit of the present invention.

Further, the operation methods of the semiconductor devices according to the aforementioned first to third embodiments may be executed by a computer as the following programs.

Program According to First Embodiment

A program for causing a computer to execute a method of measuring temperature of a semiconductor device, wherein the semiconductor device comprises:
  a temperature sensor module that outputs a non-linear digital value with respect to temperature and a substantially linear sensor voltage value with respect to the temperature;
  a storage unit that stores the temperature, the digital value, and the sensor voltage value; and
  a controller that calculates a characteristic formula using the temperature, the digital value, and the sensor voltage value stored in the storage unit, and
  the program causes the following steps to be executed:
  before the semiconductor device is mounted on a printed board,
  a step of causing the storage unit to store a first temperature under measurement of absolute temperature lower than a desired room temperature and a first digital value and a first sensor voltage value output from the temperature sensor module at the first temperature, and a second temperature under measurement of absolute temperature higher than the room temperature and a second digital value and a second sensor voltage value output from the temperature sensor module at the second temperature, after the semiconductor device is mounted on the printed board, a step of causing the storage unit to store a third temperature calculated by substituting a third sensor voltage value output from the temperature sensor module at the room temperature into a substantially linear sensor characteristic formula calculated by the controller using the first temperature, the second temperature, the first sensor voltage value, and the second sensor voltage value, the third temperature being specified as the room temperature, and a third digital value output together with the third sensor voltage value;

a step of causing the controller to calculate a first characteristic formula by the first temperature, the first digital value, the third temperature, and the third digital value and to calculate a second characteristic formula by the third temperature, the third digital value, the second temperature, and the second digital value; and a step of causing the controller to calculate, when the digital value output from the temperature sensor module is smaller than the third digital value, the temperature by substituting the digital value that has been output into the first characteristic formula and to calculate, when the digital value output from the temperature sensor module is larger than the third digital value, the temperature by substituting the digital value that has been output into the second characteristic formula.

Program According to Second Embodiment

The above program, wherein
the semiconductor device comprises:
a plurality of temperature sensor modules, and
the program causes the following steps to be executed:
a step of operating one temperature sensor module and another temperature sensor module that are adjacent to each other at a time of startup; and a step of stopping the operation of the one temperature sensor module and continuing the operation of the other temperature sensor module after the startup, wherein
the operating step comprises:
causing the one temperature sensor module to measure a plurality of first startup digital values at the time of startup;
causing the controller to calculate a plurality of first startup temperatures at the time of startup by substituting the plurality of first startup digital values into the first characteristic formula or the second characteristic formula of the one temperature sensor module;
causing the other temperature sensor module to measure a plurality of second startup digital values at the time of startup; and
causing the controller to calculate a difference between a third startup digital value calculated by substituting the plurality of first startup temperatures into the first characteristic formula or the second characteristic formula of the other temperature sensor module and the second startup digital value and to correct at least one of the first characteristic formula and the second characteristic formula of the other temperature sensor module using the difference that has been calculated.

The above program, wherein:
the temperature sensor module includes a power supply voltage monitor unit that monitors a power supply voltage of the semiconductor element, and the program comprises a step of causing the controller to correct, using the difference, the power supply voltage.

Program According to Third Embodiment

The above program that causes, in one or more other temperature sensor modules other than the one temperature sensor module and the other temperature sensor module, the controller to correct at least one of the first characteristic formula and the second characteristic formula of each of the other temperature sensor modules using the difference.

The above program further comprising a step of causing the controller to correct the power supply voltage of each of the other temperature sensor modules using the difference.
(Supplementary Note 1)
A temperature sensor comprising:
a temperature sensor module that outputs a non-linear digital value with respect to temperature and a substantially linear sensor voltage value with respect to the temperature;
a storage unit that stores the temperature, the digital value, and the sensor voltage value; and
a controller that calculates a characteristic formula using the temperature, the digital value, and the sensor voltage value stored in the storage unit,
wherein the temperature, the digital value, and the sensor voltage value stored in the storage unit include absolute temperature under measurement of absolute temperature, the digital value at the absolute temperature, and the sensor voltage value at the absolute temperature.
(Supplementary Note 2)
The temperature sensor according to Supplementary Note 1, wherein
the absolute temperature includes a first temperature and a second temperature higher than the first temperature,
the digital value includes a first digital value at the first temperature and a second digital value at the second temperature, and
the storage unit further comprises:
a third temperature that is higher than the first temperature and is lower than the second temperature; and
a third digital value at the third temperature.
(Supplementary Note 3)
The temperature sensor according to Supplementary Note 2, wherein
the absolute temperature is the temperature output from the temperature sensor module before the temperature sensor is mounted on a printed board, and
the third temperature is a temperature output from the temperature sensor module after the temperature sensor is mounted on the printed board.
(Supplementary Note 4)
The temperature sensor according to Supplementary Note 2 or 3, wherein
the controller calculates a first characteristic formula using the first temperature, the first digital value, the third temperature, and the third digital value, and
the controller calculates a second characteristic formula using the third temperature, the third digital value, the second temperature, and the second digital value.
(Supplementary Note 5)
The temperature sensor according to Supplementary Note 4, wherein
the controller calculates, when the digital value output from the temperature sensor module is smaller than the third digital value, the temperature by substituting the digital value into the first characteristic formula, and the controller calculates, when the digital value output from the temperature sensor module is larger than the third digital value, the temperature by substituting the digital value into the second characteristic formula.

(Supplementary Note 6)

The temperature sensor according to anyone of Supplementary Notes 2 to 5, wherein the first temperature is lower than a desired room temperature, the second temperature is higher than the room temperature, the storage unit comprises, as the sensor voltage value under measurement of the absolute temperature, a first sensor voltage value at the first temperature and a second sensor voltage value at the second temperature, the storage unit further comprises, as the sensor voltage value, a third sensor voltage value output from the temperature sensor module at the room temperature, the third digital value is output from the temperature sensor module together with the third sensor voltage value at the room temperature, and the third temperature is calculated by substituting the third sensor voltage value into a substantially linear sensor characteristic formula calculated by the controller using the first temperature, the second temperature, the first sensor voltage value, and the second sensor voltage value, the third temperature being specified as the room temperature.

A (The) program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

The first, second and third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A temperature sensor comprising:
a temperature sensor module that outputs a non-linear digital value with respect to temperature and a substantially linear sensor voltage value with respect to the temperature;
a storage unit that stores the temperature, the digital value, and the sensor voltage value; and
a controller that calculates a characteristic formula using the temperature, the digital value, and the sensor voltage value stored in the storage unit,
wherein the temperature, the digital value, and the sensor voltage value stored in the storage unit include an absolute temperature under an absolute temperature measurement, the digital value at the absolute temperature, and the sensor voltage value at the absolute temperature.

2. The temperature sensor according to claim 1,
wherein the absolute temperature includes a first temperature and a second temperature higher than the first temperature, the digital value includes a first digital value at the first temperature and a second digital value at the second temperature, and
wherein the storage unit further stores:
a third temperature that is higher than the first temperature and is lower than the second temperature; and
a third digital value at the third temperature.

3. The temperature sensor according to claim 2,
wherein the absolute temperature is a temperature output from the temperature sensor module before the temperature sensor is mounted on a printed board, and
wherein the third temperature is a temperature output from the temperature sensor module after the temperature sensor is mounted on the printed board.

4. The temperature sensor according to claim 2,
wherein the controller calculates a first characteristic formula using the first temperature, the first digital value, the third temperature, and the third digital value, and
wherein the controller calculates a second characteristic formula using the third temperature, the third digital value, the second temperature, and the second digital value.

5. The temperature sensor according to claim 4,
wherein, when a fourth digital value output from the temperature sensor module is smaller than the third digital value, the controller calculates a fourth temperature by substituting the fourth digital value into the first characteristic formula, and
wherein, when a fifth digital value output from the temperature sensor module is larger than the third digital value, the controller calculates a fifth temperature by substituting the fifth digital value into the second characteristic formula.

6. The temperature sensor according to claim 2,
wherein the first temperature is lower than a desired room temperature,
wherein the second temperature is higher than the room temperature,
wherein the storage unit stores, as the sensor voltage value under the absolute temperature measurement, a first sensor voltage value at the first temperature and a second sensor voltage value at the second temperature,
wherein the storage unit further stores, as the sensor voltage value, a third sensor voltage value output from the temperature sensor module at the room temperature,
wherein the third digital value is output from the temperature sensor module together with the third sensor voltage value at the room temperature, and
wherein the third temperature is calculated by substituting the third sensor voltage value into a substantially linear sensor characteristic formula calculated by the controller using the first temperature, the second temperature, the first sensor voltage value, and the second sensor voltage value, the third temperature being specified as the room temperature.

* * * * *